United States Patent
Liao et al.

(10) Patent No.: US 10,658,036 B2
(45) Date of Patent: May 19, 2020

(54) MEMORY STORAGE APPARATUS AND FORMING METHOD OF RESISTIVE MEMORY DEVICE

(71) Applicant: Winbond Electronics Corp., Tiachung (TW)

(72) Inventors: Shao-Ching Liao, Taichung (TW); Ping-Kun Wang, Taichung (TW); Ming-Che Lin, Taichung (TW); Min-Chih Wei, Taichung (TW); Chia-Hua Ho, Taichung (TW); Chien-Min Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 64 days.

(21) Appl. No.: 16/045,749

(22) Filed: Jul. 26, 2018

(65) Prior Publication Data
US 2019/0035459 A1   Jan. 31, 2019

(30) Foreign Application Priority Data
Jul. 28, 2017   (CN) .......................... 2017 1 0628986

(51) Int. Cl.
*G11C 11/00*   (2006.01)
*G11C 13/00*   (2006.01)
(Continued)

(52) U.S. Cl.
CPC ........ *G11C 13/0069* (2013.01); *G11C 13/004* (2013.01); *H01L 45/08* (2013.01);
(Continued)

(58) Field of Classification Search
CPC ..... G11C 13/0069; G11C 13/004; G11C 7/04; H01L 45/08; H01L 45/146; H01L 45/1233; H01L 45/1641
See application file for complete search history.

(56) References Cited

U.S. PATENT DOCUMENTS 8,869,436 B2   10/2014   Tsai et al.
8,902,629 B2 *   12/2014   Kawai ................... H01L 27/101
                                                           365/148
(Continued)

OTHER PUBLICATIONS

Sungho Kim et al., "Physical electro-thermal model of resistive switching in bi-layered resistance-change memory", Scientific Reports, Apr. 2013, pp. 1-6.
(Continued)

*Primary Examiner* — Toan K Le
(74) *Attorney, Agent, or Firm* — JCIPRNET

(57) ABSTRACT

A forming method of a resistive memory device is provided. The forming method includes: conducting a forming procedure to apply a forming voltage to the resistive memory device such that the resistive memory device changes from a high resistive state to a low resistive state and measuring a first current of the resistive memory device; performing a thermal step on the resistive memory device and measuring a second current of the resistive memory device; and comparing the second current to the first current and determining to apply a first voltage signal or a second voltage signal to the resistive memory device or to finish the forming procedure according to a comparison result of the first current and the second current. In addition, a memory storage apparatus including a resistive memory device is also provided.

18 Claims, 4 Drawing Sheets

(51) Int. Cl.
*H01L 45/00* (2006.01)
*G11C 7/04* (2006.01)

(52) U.S. Cl.
CPC ........ *H01L 45/1233* (2013.01); *H01L 45/146* (2013.01); *H01L 45/1641* (2013.01); *G11C 7/04* (2013.01); *G11C 2013/0054* (2013.01); *G11C 2013/0083* (2013.01)

(56) References Cited

U.S. PATENT DOCUMENTS

| | | | |
|---|---|---|---|
| 9,231,208 B2 | 1/2016 | Lin et al. | |
| 9,437,266 B2 | 9/2016 | Lee et al. | |
| 2011/0305066 A1* | 12/2011 | Nazarian | G11C 13/0011 |
| | | | 365/148 |
| 2013/0058153 A1* | 3/2013 | Chang | G11C 13/0007 |
| | | | 365/148 |
| 2017/0237002 A1* | 8/2017 | Rebello | H01L 45/04 |
| | | | 257/4 |
| 2017/0372778 A1* | 12/2017 | Ha | G11C 11/16 |
| 2018/0366197 A1* | 12/2018 | Wang | G11C 13/0097 |

OTHER PUBLICATIONS

Shimeng Yu et al., "Investigating the switching dynamics and multilevel capability of bipolar metal oxide resistive switching memory", Applied Physics Letters, Mar. 2011, pp. 1-4.

* cited by examiner

MEMORY STORAGE APPARATUS AND FORMING METHOD OF RESISTIVE MEMORY DEVICE

CROSS-REFERENCE TO RELATED APPLICATION

This application claims the priority benefit of China application serial no. 201710628986.0, filed on Jul. 28, 2017. The entirety of the above-mentioned patent application is hereby incorporated by reference herein and made a part of this specification.

BACKGROUND OF THE INVENTION

1. Field of the Invention

The invention relates to a memory storage apparatus and a forming method of a resistive memory device. More particularly, the invention relates to a resistive memory storage apparatus and a forming method of a resistive memory device.

2. Description of Related Art

In recent years, the resistive memory (such as the resistive random access memory (RRAM)) has experienced rapid development and attracted much attention currently since it is viewed as a type of structure which may be applied to future memory. As the resistive memory is equipped with potential advantages such as low power consumption, high speed operation, high density, and compatibility to the complementary metal oxide semiconductor (CMOS) processing technology, and thus, the resistive memory is suitable for serving as a non-volatile memory device of the next generation. The capability of high temperature data retention (HTDR) of the resistive memory device is crucial in terms of reliability testing and commercialization. In existing technology, processing adjustment, algorithm correction, or electrical parameter adjustment is adopted to improve the capability of high temperature data retention; nevertheless, there is still room for improvement.

SUMMARY OF THE INVENTION

The invention provides a forming method of a resistive memory device and a memory storage apparatus with robust filaments and favorable capability of high temperature data retention.

The forming method of the resistive memory device of the invention includes: conducting a forming procedure to apply a forming voltage to the resistive memory device such that the resistive memory device changes from a high resistive state to a low resistive state and measuring a first current of the resistive memory device; performing a thermal step on the resistive memory device and measuring a second current of the resistive memory device; and comparing the second current to the first current and determining to apply a first voltage signal or a second voltage signal to the resistive memory device or to finish the forming procedure according to a comparison result of the first current and the second current.

The memory storage apparatus of the invention includes a resistive memory device and a memory controller. The memory controller conducts a forming procedure to apply a forming voltage to the resistive memory device, such that the resistive memory device changes from a high resistive state to a low resistive state. The memory controller measures a first current of the resistive memory device. After the resistive memory device is heated, the memory controller measures a second current of the resistive memory device. The memory controller compares the second current to the first current. The memory controller determines to apply a first voltage signal or a second voltage signal to the resistive memory device or to finish the forming procedure according to a comparison result of the first current and the second current.

To sum up, in the embodiments of the invention, the forming method of the resistive memory device includes the thermal step. Therefore, the resistive memory device using the forming method of the embodiments of the invention has robust filaments as well as favorable capability of high temperature data retention.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Herein, several embodiments of the invention are introduced to describe the invention; however the invention is not limited by the embodiments. Suitable combinations among the embodiments are also allowed. The term "coupled to" used throughout the embodiments (including claims) may refer to any direct and indirect connection means. For example, if a first device is described as being coupled to a second device in the embodiments, the sentence should be explained as the first device may be connected to the second device directly, or the first device may, through any other device or through certain connection means, be connected to the second device indirectly. In addition, the word "signal" may refer to at least one current, voltage, electric charge, temperature, data, electromagnetic wave, or any other signal or signals.

Figure 1:
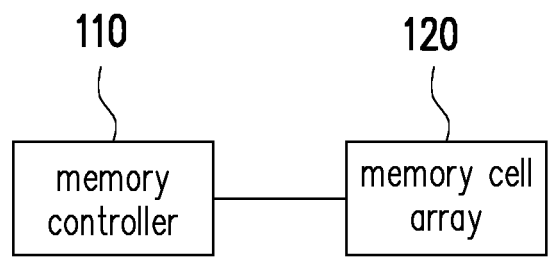
FIG. 1 is a schematic view illustrating a memory storage apparatus according to an embodiment of the invention.
Figure 2:
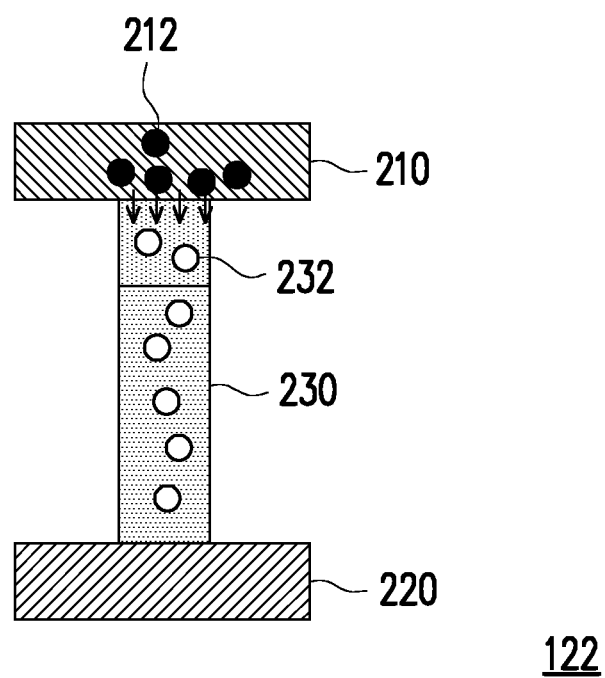
FIG. 2 is a schematic view illustrating a resistive memory device according to an embodiment of the invention.

FIG. 1 is a schematic view illustrating a memory storage apparatus according to an embodiment of the invention. FIG. 2 is a schematic view illustrating a resistive memory device according to an embodiment of the invention. Referring to FIG. 1 and FIG. 2, a memory storage apparatus 100 of the present embodiment includes a memory controller 110 and a memory cell array 120. The memory cell array 120 is coupled to the memory controller 110. The memory cell array 120 includes a plurality of resistive memory devices 122 arranged in array. In the present embodiment, the resistive memory device 122 includes an upper electrode 210, a lower electrode 220, and a dielectric layer 230. The upper electrode 210 and the lower electrode 220 are good conductors and may be made of materials providing electronic conductivity such as metal, transition metal, metal oxide, and metal nitride. The materials of the two electrodes may be identical or different. The dielectric layer 230 is disposed between the upper electrode 210 and the lower electrode 220. A material of the dielectric layer 230 includes dielectric materials, for example, transition metal oxide, silicon oxide, or aluminum oxide. The resistive memory device 122 has two resistance states, which can be changed by applying different voltages to the electrodes at two ends for providing data storage function.

In the present embodiment, the memory controller 110 is configured to conduct a forming procedure to the resistive memory device 122. The forming procedure refers to a process of performing initialization to the resistive memory device 122. In the process, a bias voltage continuously applied to the electrodes at two ends of the resistive memory device 122, so as to generate an external electric field to the dielectric layer 230. When the external electric field exceeds a threshold value, a dielectric breakdown occurs and filaments are thus generated, and that the dielectric layer 230 changes from a high resistance state (HRS) to a low resistance state (LRS). Such breakdown is not permanent, and a resistance value of the dielectric layer 230 may still be changed depending on voltages applied subsequently.

On the other hand, after the filaments of the resistive memory device 122 are formed, the filaments are divergently distributed most of the time, such that under a high temperature environment (e.g., greater than 85° C.), oxygen ions 212 of the resistive memory device 122 in the low resistance state may easily drift from the electrode layer (e.g., the upper electrode 210) to the dielectric layer 230 to be reunited with oxygen vacancies 232 within. A current transmission path in the dielectric layer 230 is likely to be blocked, leading to the filaments within to be broken. In the present embodiment, the forming method of the resistive memory device 122 includes a thermal step, for example, a thermal enhanced detrapping (TED) operation. In the embodiments of the invention, through applying a heat treatment (e.g., greater than 85° C.) to the resistive memory device 122, the filaments may be re-organized and gather together more intensely. Further, a high temperature environment with overly high energy may cause the filaments of the resistive memory device 122 to overly gather together, whereas a high temperature environment with insufficient energy may cause the filaments of the resistive memory device 122 to gather together poorly. In the embodiments of the invention, whether additional and adequate energy is to be applied to the resistive memory device 122 may be determined according to a ratio of decrease of the currents of the resistive memory device 122 after heated. As such, the filaments are restored and repaired, and the capability of high temperature data retention of the memory storage apparatus 100 is thereby improved.

Figure 3:
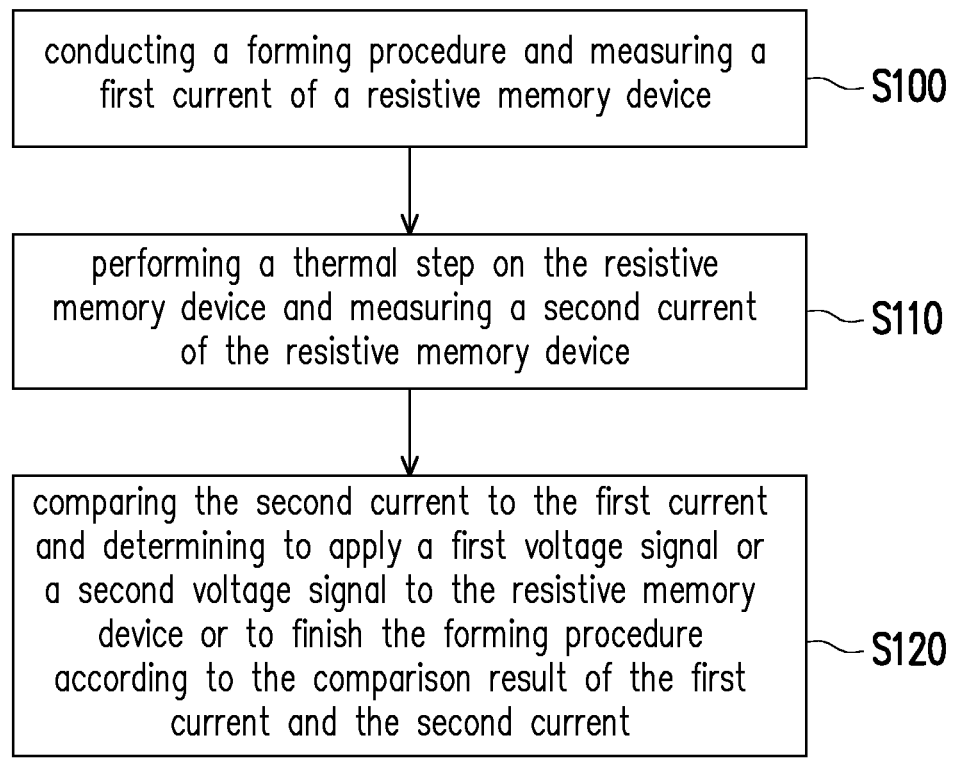
FIG. 3 is a flowchart illustrating steps of a forming method of a resistive memory device according to an embodiment of the invention.

FIG. 3 is a flowchart illustrating steps of a forming method of a resistive memory device according to an embodiment of the invention. Referring to FIG. 1 to FIG. 3, a forming method of the resistive memory device of the present embodiment is, for example, at least suitable for the memory storage apparatus 100 and the resistive memory device 122 of FIG. 1 and FIG. 2. In step S100, the memory controller 110 conducts a forming procedure for applying a forming voltage to the resistive memory device 122 and measures a first current of the resistive memory device 122. Herein, if the first current is greater than a reference current, it is verified that the resistive memory device 122 successfully changes from the high resistive state to the low resistive state. In step S110, the memory controller 110 performs a thermal step on the resistive memory device 122 and measures a second current of the resistive memory device 122. In an embodiment, the thermal step may be executed by other suitable thermal devices or testing machines. In step S120, the memory controller 110 compares the second current to the first current and determines to apply a first voltage signal or a second voltage signal to the resistive memory device 122 or to finish the forming procedure according to a comparison result of the first current and the second current. In an embodiment, the first voltage signal is, for example, a negative voltage, and the second voltage signal is, for example, a positive voltage. The invention is not intended to limit waveforms and phases of the first voltage signal and the second voltage signal.

Figure 6A:
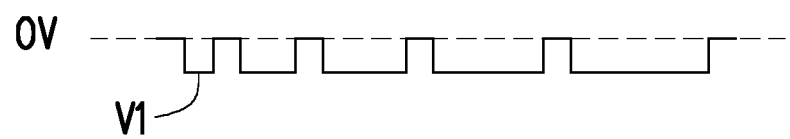
FIG. 6A is a schematic diagram illustrating waveforms of a first voltage signal according to an embodiment of the invention.
Figure 6B:
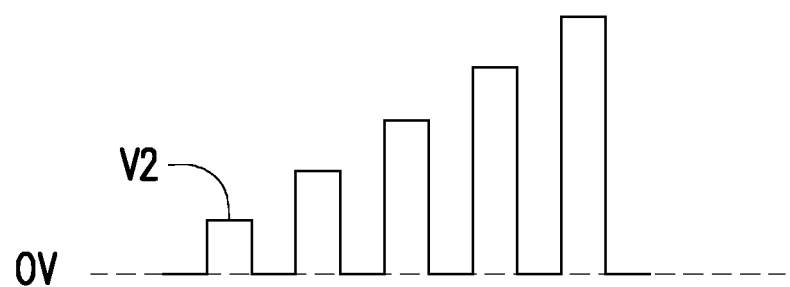
FIG. 6B is a schematic diagram illustrating waveforms of a second voltage signal according to an embodiment of the invention.

In an embodiment, the comparison result of the first current and the second current, for example, includes that a ratio of reduction of the second current is greater than, less than, or equal to a predetermined ratio (e.g., 10%, but the ratio is not intended to limit the invention). For instance, compared to the first current, if the ratio of reduction of the second current is equal to 10%, the memory controller 110 finishes the forming procedure. Compared to the first current, if the ratio of reduction of the second current is less than 10%, the memory controller 110 applies the first voltage signal to the resistive memory device 122. Compared to the first current, if the ratio of reduction of the second current is greater than 10%, the memory controller 110 applies the second voltage signal to the resistive memory device 122. As shown in FIG. 6A and FIG. 6B, the phase of the first voltage signal may be opposite to a phase of the forming voltage, and the phase of the second voltage signal may be identical to the phase of the forming voltage. The filaments may be gathered together more intensely through applying the first voltage signal, wherein an energy of the second voltage signal is greater than an energy of the first voltage signal, so as to re-construct the overly narrowed filaments. For instance, as shown in FIG. 6A and FIG. 6B, a maximum pulse height of the second voltage signal may be greater than a maximum pulse height of the first voltage signal. Furthermore, a maximum pulse width of the second voltage signal may be less than a maximum pulse width of the first voltage signal. The capability of high temperature data retention of the memory storage apparatus 100 may thereby be improved through adopting the resistive memory device formed by the forming method provided by the present embodiment.

Figure 4:
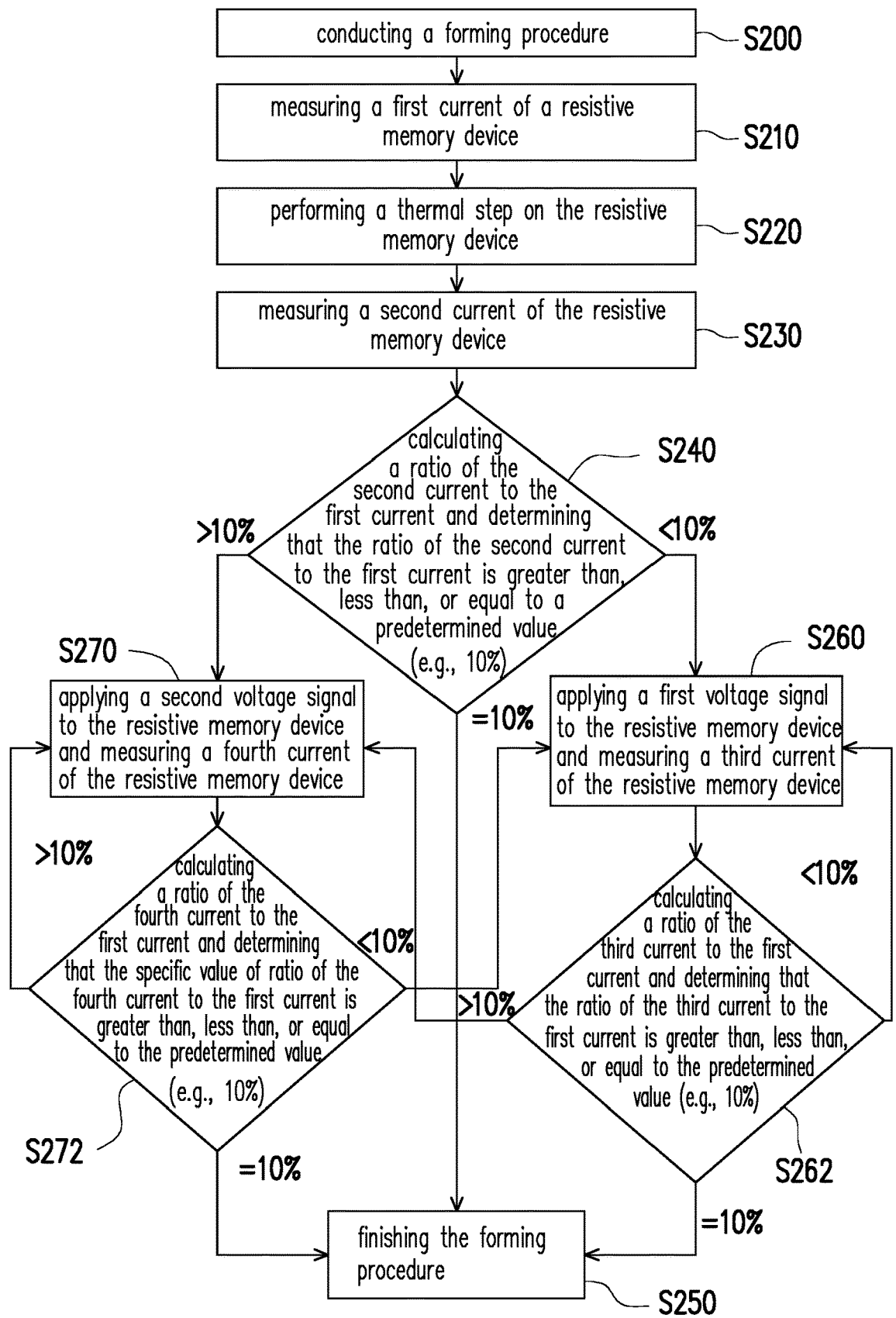
FIG. 4 is a flowchart illustrating steps of a forming method of a resistive memory device according to another embodiment of the invention.

FIG. 4 is a flowchart illustrating steps of a forming method of a resistive memory device according to another embodiment of the invention. Referring to FIG. 1, FIG. 2, and FIG. 4, a forming method of the resistive memory device of the present embodiment is, for example, at least suitable for the memory storage apparatus 100 and the resistive memory device 122 of FIG. 1 and FIG. 2. In step S200, the memory controller 110 conducts the forming procedure. In step S210, the memory controller 110 measures the first current of the resistive memory device 122. In step S220, the memory controller 110 performs the thermal step on the resistive memory device 122. In an embodiment, the thermal step may be executed by other suitable thermal devices or testing machines. In step S230, the memory controller 110 measures the second current of the resistive memory device 122. In the present embodiment, the first current refers to the current measured before the thermal step (step S220) is performed on the resistive memory device 122, and the second current refers to the current measured after the thermal step (step S220) is performed on the resistive memory device.

Next, in step S240, the memory controller 110 calculates a ratio of the second current to the first current and determines that the ratio of the second current to the first current is greater than, less than, or equal to a predetermined value (e.g., 10%, but the predetermined value is not intended to limit the invention). If the ratio of the second current to the first current is equal to the predetermined value, the memory controller 110 performs step S250 and finishes the forming procedure. If the ratio of the second current to the first current is less than the predetermined value, the memory controller 110 performs step S260, applies the first voltage signal to the resistive memory device 122, and measures a third current of the resistive memory device 122. The third current refers to the current measured after the first voltage signal is applied to the resistive memory device 122. If the ratio of the second current to the first current is greater than the predetermined value, the memory controller 110 performs step S270, applies the second voltage signal to the resistive memory device 122, and measures a fourth current of the resistive memory device 122. The fourth current refers to the current measured after the second voltage signal is applied to the resistive memory device 122.

Next, in step S262, the memory controller 110 calculates a ratio of the third current to the first current and determines that the ratio of the third current to the first current is greater than, less than, or equal to the predetermined value (e.g., 10%, but the predetermined value is not intended to limit the invention). If the ratio of the third current to the first current is equal to the predetermined value, the memory controller 110 performs step S250 and finishes the forming procedure. If the ratio of the third current to the first current is less than the predetermined value, the memory controller 110 performs step S260 again and applies the first voltage signal to the resistive memory device 122. If the ratio of the third current to the first current is greater than the predetermined value, the memory controller 110 performs step S270 again and applies the second voltage signal to the resistive memory device 122.

On the other hand, in step S272, the memory controller 110 calculates a ratio of the fourth current to the first current and determines that the ratio of the fourth current to the first current is greater than, less than, or equal to the predetermined value (e.g., 10%, but the predetermined value is not intended to limit the invention). If the ratio of the fourth current to the first current is equal to the predetermined value, the memory controller 110 performs step S250 and finishes the forming procedure. If the ratio of the fourth current to the first current is less than the predetermined value, the memory controller 110 performs step S260 again and applies the first voltage signal to the resistive memory device 122. If the ratio of the fourth current to the first current is greater than the predetermined value, the memory controller 110 performs step S270 again and applies the second voltage signal to the resistive memory device 122. In addition, for the forming method of the resistive memory device provided by the present embodiment, enough teaching, suggestion, and implementation illustration are obtained from the above embodiments of FIG. 1 to FIG. 3, and that detailed descriptions are not further provided hereinafter.

Figure 5:
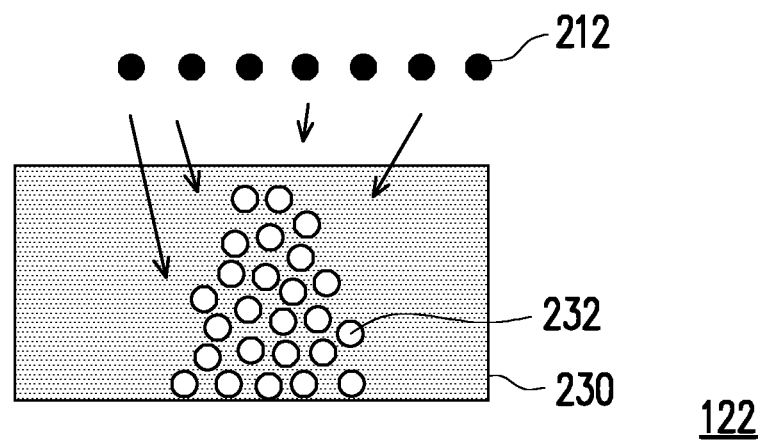
FIG. 5 is a schematic diagram illustrating distribution of oxygen vacancies in a dielectric layer in the resistive memory device of the embodiment of FIG. 2.

In the present embodiment, after the thermal step (step S220) is performed on the resistive memory device 122, the memory controller 110 applies the first voltage signal or the second voltage signal to the resistive memory device 122 until a reduced magnitude of current measured after the thermal step compared to the current measured before the thermal step is approximately equal to the predetermined value (e.g., 10%, but the predetermined value is not intended to limit the invention) and then finishes the forming procedure. As such, the resistive memory device 122 using the forming method of the present embodiment has robust filaments as shown in FIG. 5. FIG. 5 is a schematic diagram illustrating distribution of oxygen vacancies in a dielectric layer in the resistive memory device of the embodiment of FIG. 2. In the present embodiment, the oxygen vacancies 232 in the resistive memory device 122 are not randomly distributed overly in the dielectric layer 230. Moreover, the oxygen vacancies 232 and the oxygen ions 212 in the resistive memory device 122 are not overly incorporated at an interface between the electrode layer and the dielectric layer 230 caused by overheating.

FIG. 6A is a schematic diagram illustrating waveforms of a first voltage signal according to an embodiment of the invention. FIG. 6B is a schematic diagram illustrating waveforms of a second voltage signal according to an embodiment of the invention. Referring to FIG. 6A and FIG. 6B, a first voltage signal V1 of the present embodiment includes a plurality of pulse signals and has a voltage signal level less than zero. In the present embodiment, pulse widths of the first voltage signal V1 gradually increase, and pulse heights remain equal. A second voltage signal V2 of the present embodiment includes a plurality of pulse signals and has a voltage signal level greater than zero. In the present embodiment, pulse widths of the second voltage signal V2 are equal, and pulse heights gradually increase. The signal waveforms illustrated in FIG. 6A and FIG. 6B are merely exemplary, and the invention is not intended to limit waveforms and phases of the first voltage signal V1 and the second voltage signal V2.

In view of the foregoing, in the embodiments of the invention, the forming method of the resistive memory device includes the thermal step. The thermal step in the forming procedure may be performed to restore and repair the filaments, so as to improve the capability of high temperature data retention of the memory storage apparatus. Moreover, after the thermal step is performed on the resistive memory device, the memory controller applies the first voltage signal or the second voltage signal to the resistive memory device until the reduced magnitude of current is approximately equal to the predetermined value and then finishes the forming procedure. Therefore, the resistive memory device using the forming method of the embodiments of the invention has robust filaments as well as favorable capability of high temperature data retention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A forming method of a resistive memory device, comprising:
   conducting a forming procedure to apply a forming voltage to the resistive memory device such that the resistive memory device changes from a high resistive state to a low resistive state, and measuring a first current of the resistive memory device after applying the forming voltage;
   performing a thermal step on the resistive memory device after measuring the first current, and measuring a second current of the resistive memory device after performing the thermal step; and
   comparing the second current to the first current, and determining to apply a first voltage signal or a second voltage signal to the resistive memory device or to finish the forming procedure according to a comparison result of the first current and the second current,
   wherein an energy of the second voltage signal is greater than an energy of the first voltage signal.

2. The forming method of the resistive memory device as claimed in claim 1, wherein the step of comparing the second current to the first current comprises:
   calculating a ratio of the second current to the first current; and
   determining that the ratio of the second current to the first current is greater than, less than, or equal to a predetermined value so as to obtain the comparison result;
   wherein the step of determining to apply the first voltage signal or the second voltage signal to the resistive memory device or to finish the forming procedure according to the comparison result comprises:
   applying the first voltage signal to the resistive memory device if the ratio of the second current to the first current is less than the predetermined value;
   applying the second voltage signal to the resistive memory device if the ratio of the second current to the first current is greater than the predetermined value; and
   finishing the forming procedure if the ratio of the second current to the first current is equal to the predetermined value.

3. The forming method of the resistive memory device as claimed in claim 2, further comprising:
   measuring a third current of the resistive memory device after performing the step of applying the first voltage signal to the resistive memory device;
   calculating a ratio of the third current to the first current; and
   comparing the ratio of the third current to the first current to the predetermined value;
   wherein the first voltage signal is further applied to the resistive memory device if the ratio of the third current to the first current is less than the predetermined value;
   the second voltage signal is further applied to the resistive memory device if the ratio of the third current to the first current is greater than the predetermined value; and
   the forming procedure is finished if the ratio of the third current to the first current is equal to the predetermined value.

4. The forming method of the resistive memory device as claimed in claim 2, further comprising:
   measuring a fourth current of the resistive memory device after performing the step of applying the second voltage signal to the resistive memory device;
   calculating a ratio of the fourth current to the first current; and
   comparing the ratio of the fourth current to the first current to the predetermined value;
   wherein the first voltage signal is further applied to the resistive memory device if the ratio of the fourth current to the first current is less than the predetermined value;
   the second voltage signal is further applied to the resistive memory device if the ratio of the fourth current to the first current is greater than the predetermined value; and
   the forming procedure is finished if the ratio of the fourth current to the first current is equal to the predetermined value.

5. The forming method of the resistive memory device as claimed in claim 1, wherein a phase of the first voltage signal is opposite to a phase of the forming voltage, and a phase of the second voltage signal is identical to the phase of the forming voltage.

6. The forming method of the resistive memory device as claimed in claim 5, wherein a maximum pulse height of the second voltage signal is greater than a maximum pulse height of the first voltage signal.

7. The forming method of the resistive memory device as claimed in claim 6, wherein a maximum pulse width of the first voltage signal is greater than a maximum pulse width of the second voltage signal.

8. The forming method of the resistive memory device as claimed in claim 5, wherein the first voltage signal comprises a plurality of pulse signals, pulse widths of the pulse signals gradually increase, and pulse heights of the pulse signals are equal.

9. The forming method of the resistive memory device as claimed in claim 5, wherein the second voltage signal comprises a plurality of pulse signals, pulse widths of the pulse signals are equal, and pulse heights of the pulse signals gradually increase.

10. A memory storage apparatus, comprising:
    a resistive memory device; and
    a memory controller, configured to:
    conduct a forming procedure to apply a forming voltage to the resistive memory device such that the resistive memory device changes from a high resistive state to a low resistive state, and measure a first current of the resistive memory device after applying the forming voltage;
    perform a thermal operation by heating the resistive memory device after measuring the first current, and measure a second current of the resistive memory device after the resistive memory device is heated;
    compare the second current to the first current; and
    determine to apply a first voltage signal or a second voltage signal to the resistive memory device or to finish the forming procedure according to a comparison result of the first current and the second current,
    wherein an energy of the second voltage signal is greater than an energy of the first voltage signal.

11. The memory storage apparatus as claimed in claim 10, wherein the memory controller calculates a ratio of the second current to the first current and determines that the ratio of the second current to the first current is greater than, less than, or equal to a predetermined value so as to obtain the comparison result, wherein the memory controller applies the first voltage signal to the resistive memory device if the ratio of the second current to the first current is less than the predetermined value, the memory controller applies the second voltage signal to the resistive memory device if the ratio of the second current to the first current is greater than the predetermined value, and the memory controller applies neither the first voltage signal nor the second voltage signal to the resistive memory device and finishes the forming procedure if the ratio of the second current to the first current is equal to the predetermined value.

12. The memory storage apparatus as claimed in claim 11, wherein the memory controller measures a third current of the resistive memory device after the memory controller applies the first voltage signal to the resistive memory device and calculates a ratio of the third current to the first current, wherein the memory controller further applies the first voltage signal to the resistive memory device if the ratio of the third current to the first current is less than the predetermined value, the memory controller further applies the second voltage signal to the resistive memory device if the ratio of the third current to the first current is greater than the predetermined value, and the memory controller applies neither the first voltage signal nor the second voltage signal to the resistive memory device and finishes the forming procedure if the ratio of the third current to the first current is equal to the predetermined value.

13. The memory storage apparatus as claimed in claim 12, wherein the memory controller measures a fourth current of the resistive memory device after the memory controller applies the second voltage signal to the resistive memory device and calculates a ratio of the fourth current to the first current, wherein the memory controller further applies the first voltage signal to the resistive memory device if the ratio of the fourth current to the first current is less than the predetermined value, the memory controller further applies the second voltage signal to the resistive memory device if the ratio of the fourth current to the first current is greater than the predetermined value, and the memory controller applies neither the first voltage signal nor the second voltage signal to the resistive memory device and finishes the forming procedure if the ratio of the fourth current to the first current is equal to the predetermined value.

14. The memory storage apparatus as claimed in claim 10, wherein a phase of the first voltage signal is opposite to a phase of the forming voltage, and a phase of the second voltage signal is identical to the phase of the forming voltage.

15. The memory storage apparatus as claimed in claim 14, wherein a maximum pulse height of the second voltage signal is greater than a maximum pulse height of the first voltage signal.

16. The memory storage apparatus as claimed in claim 15, wherein a maximum pulse width of the first voltage signal is greater than a maximum pulse width of the second voltage signal.

17. The memory storage apparatus as claimed in claim 14, wherein the first voltage signal comprises a plurality of pulse signals, pulse widths of the pulse signals gradually increase, and pulse heights of the pulse signals are equal.

18. The memory storage apparatus as claimed in claim 14, wherein the second voltage signal comprises a plurality of pulse signals, pulse widths of the pulse signals are equal, and pulse heights of the pulse signals gradually increase.

* * * * *